(12) United States Patent
Arai (10) Patent No.: US 11,570,389 B2
(45) Date of Patent: Jan. 31, 2023

(54) IMAGING APPARATUS FOR DOWNSIZING AN IMAGE SENSOR AND A SIGNAL PROCESSOR

(71) Applicant: CANON KABUSHIKI KAISHA, Tokyo (JP)

(72) Inventor: Tatsuya Arai, Funabashi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/546,634

(22) Filed: Aug. 21, 2019

(65) Prior Publication Data
US 2020/0068158 A1 Feb. 27, 2020

(30) Foreign Application Priority Data
Aug. 22, 2018 (JP) .............................. JP2018-155765

(51) Int. Cl.
*H04N 5/3745* (2011.01)
*H01L 27/146* (2006.01)
(Continued)

(52) U.S. Cl.
CPC ..... *H04N 5/3745* (2013.01); *H01L 27/14621* (2013.01); *H01L 27/14627* (2013.01);
(Continued)

(58) Field of Classification Search
CPC ............. H04N 5/3745; H04N 5/23212; H04N 5/3532; H04N 5/378; H01L 27/14621; H01L 27/14627; H01L 27/14643
See application file for complete search history.

(56) References Cited

U.S. PATENT DOCUMENTS

| 8,928,791 B2 | 1/2015 | Okita et al. |
| 9,270,911 B2 | 2/2016 | Taniguchi |

(Continued)

FOREIGN PATENT DOCUMENTS

| JP | 2004129217 A | 4/2004 |
| JP | 2010219958 A | 9/2010 |

(Continued)

OTHER PUBLICATIONS

Notice of Reasons for Refusal issued by the Japan Patent Office dated Jul. 19, 2022 in corresponding JP Patent Application No. 2018-155765, with English translation.

*Primary Examiner* — Antoinette T Spinks
(74) *Attorney, Agent, or Firm* — Carter, DeLuca & Farrell LLP (57) ABSTRACT

The present invention relates to an imaging apparatus for realizing real time image display and the like while controlling the processing performance of an external circuit and the size of the circuit when outputting a large amount of data from an image sensor at a high speed, and is provided with (a) an image sensor including, a plurality of light receiving units disposed in rows and columns, an A/D conversion unit, a compression unit for compressing outputs from the A/D conversion unit row by row, and (b) a first data processing unit for thinning compressed data row by row, a first data decompression unit that decompresses outputs of the first data processing unit; and a first image processing unit which carries out a predetermined processing on outputs of the first data decompression unit.

16 Claims, 10 Drawing Sheets

(51) Int. Cl.
*H04N 5/378* (2011.01)
*H04N 5/353* (2011.01)
*H04N 5/232* (2006.01)

(52) U.S. Cl.
CPC ... *H01L 27/14643* (2013.01); *H04N 5/23212* (2013.01); *H04N 5/3532* (2013.01); *H04N 5/378* (2013.01)

(56) References Cited

U.S. PATENT DOCUMENTS

| | | | |
|---|---|---|---|
| 2003/0107777 A1* | 6/2003 | Yamade | H04N 1/00424 358/442 |
| 2006/0158682 A1* | 7/2006 | Atsumi | H04N 1/00307 358/1.15 |
| 2006/0274953 A1* | 12/2006 | Wada | H04N 19/60 382/232 |
| 2007/0058947 A1* | 3/2007 | Yoshida | H04N 5/772 386/224 |
| 2009/0316017 A1* | 12/2009 | Ichii | H04N 21/4223 348/222.1 |
| 2011/0074920 A1* | 3/2011 | Tsukagoshi | H04N 13/139 348/43 |
| 2013/0113892 A1* | 5/2013 | Nakamaru | H04N 13/111 348/47 |
| 2015/0281539 A1* | 10/2015 | Ueki | H04N 19/117 348/298 |
| 2018/0109802 A1* | 4/2018 | Takeda | H04N 19/105 |
| 2020/0068158 A1* | 2/2020 | Arai | H04N 5/23212 |
| 2021/0142072 A1* | 5/2021 | Matsumoto | G06K 9/00771 |

FOREIGN PATENT DOCUMENTS

| | | |
|---|---|---|
| JP | 2013106194 A | 5/2013 |
| JP | 2014103543 A | 6/2014 |
| JP | 2015136093 A | 7/2015 |
| JP | 2018046324 A | 3/2018 |

* cited by examiner

IMAGING APPARATUS FOR DOWNSIZING AN IMAGE SENSOR AND A SIGNAL PROCESSOR

BACKGROUND OF THE INVENTION

Field of the Invention

The present invention relates to an imaging apparatus having a solid image sensor and signal processing unit that can be downsized.

Description of the Related Art

There is an image sensor that is made of a sealed multilayered structure of a semiconductor substrate that includes a light detecting unit that converts received light into an electrical signal and a semiconductor substrate that includes peripheral circuits for processing the electrical signal.

Such an image sensor converts received light into the electrical signal, processes it to generate image data, outputs such image data in an uncompressed state (such as RAW data) and transmits it to a processing circuit outside of the image sensor.

In addition, signal processing such as, for example, demosaic processing, defect correction and the like has been conducted in the processing circuit outside of the image sensor (refer, for example, to Japanese unexamined Patent Publication No. 2010-219958).

However, in recent years, image sensors have been required for improved imaging performance such as higher resolution, swifter processing from shooting still images to their recording, increases in the number of continuous shooting pictures and the speed of continuous shooting, more rapid frame rate for movie images, and the capturing of still and movie images.

In accordance with such improvements in imaging performance, data volume per frame has increased and image data for each frame is generated faster. That means that a larger volume of data needs to be processed in a faster manner.

In this regard, Japanese unexamined Patent Publication No. 2013-106194 shows a method of transferring a large volume of data to the outside at a high speed by outputting data after compression processing.

However, when data is compressed in an image sensor so that a larger volume of data can be output more swiftly, an external processing circuit, which decompresses data and then generate images, came to be required for higher performance.

As a result, the size of the circuit of an external processing circuit became larger and caused constraints.

Although Japanese unexamined Patent Publication No. 2013-106194 discloses the advantages of an increase in the output data volume and data output speed, it does not consider or solve the issue of downsizing of imaging apparatus as a whole.

SUMMARY OF THE INVENTION

One of the aspects of the present invention is to solve issues including the one disclosed in the above, as well as to provide an imaging apparatus that enables downsizing of the image sensor and signal processing unit, and realizes image processing such as real time image display and the like.

In order to achieve the above, one of the aspects of the present invention includes an imaging apparatus comprising,
(a) an image sensor including,
a plurality of light receiving units disposed in rows and columns;
an A/D conversion unit that A/D converts outputs of the plurality of light receiving units;
a compression unit that outputs compressed image data by compressing outputs from the A/D conversion unit by a unit of a predetermined pixel block, which is a part of the plurality of light receiving units; and
(b) a controller having a processor which executes instructions stored in a memory or having circuitry, the controller being configured to function as:
first data processing unit in which a frame of compressed image data output from the compression unit of the image sensor undergoes thinning processing by the unit of the predetermined pixel-block;
a first data decompression unit that decompresses outputs of the first data processing unit; and
a first image processing unit which carries out a predetermined processing on outputs of the first data decompression unit.

Further features of the present invention will become apparent from the following description of exemplary embodiments with reference to the attached figures.

DESCRIPTION OF THE EMBODIMENTS

First Embodiment

Based on the following embodiments, one of modes of the present invention is explained in detail below.

Figure 1:
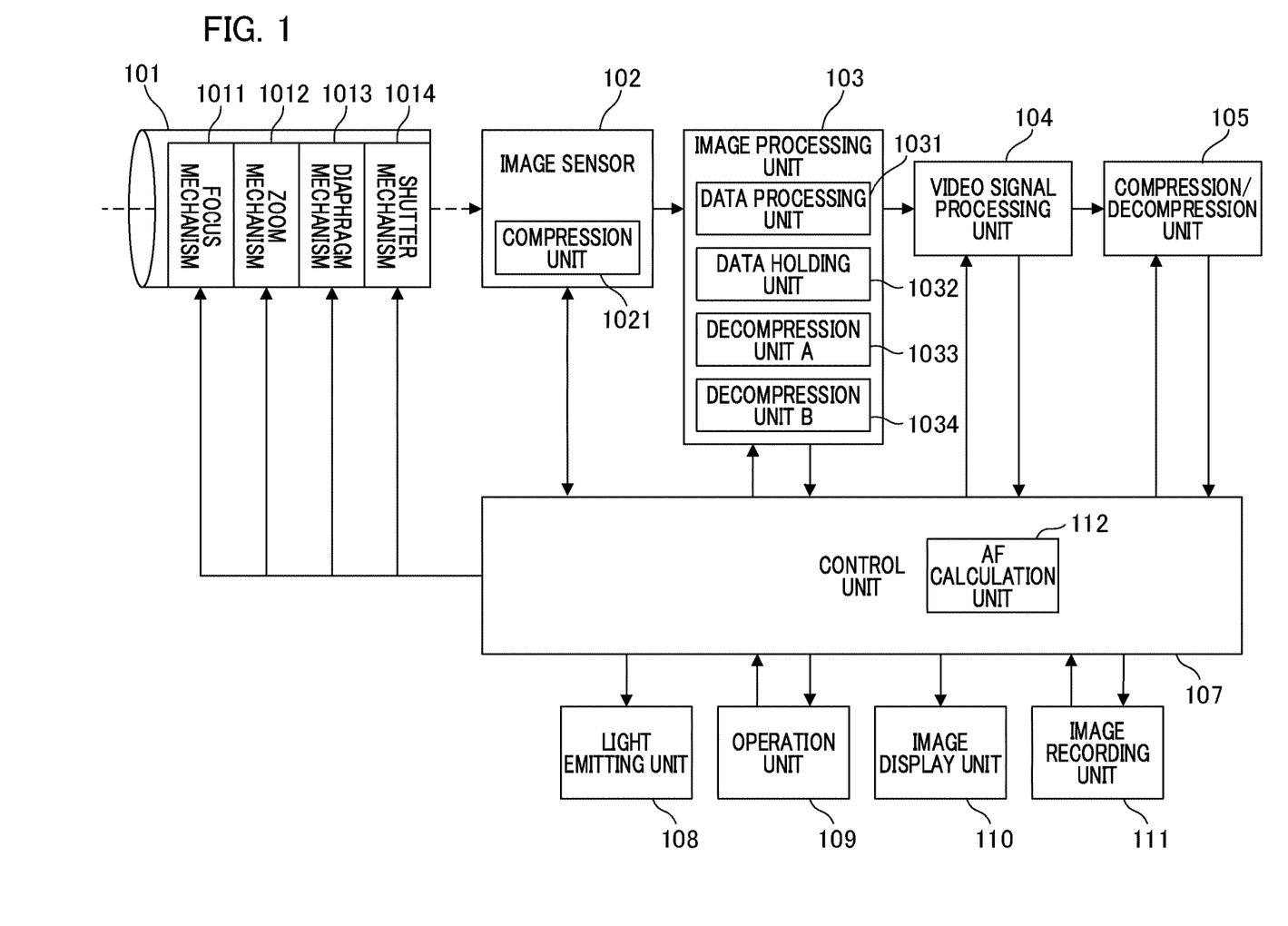
FIG. 1 is a block diagram showing the configuration of the imaging apparatus according to a first embodiment.

FIG. 1 is a block diagram showing a configuration of the imaging apparatus of the first embodiment.

The imaging apparatus shown in the FIG. 1 is provided with an optical lens barrel 101, an image sensor 102, an image processing unit 103, a video processing unit 104, a compression/decompression unit 105, a control unit 107, a light emitting unit 108, an operation unit 109, an image display unit 110, an image recording unit 111, and an AF calculation unit 112 and the like The optical lens barrel 101 has a plurality of lenses to collect light from objects to the image sensor 102, and is provided with a focus mechanism 1011, which is composed of a focus lens and a focus control circuit to adjust focusing. It is also provided with a zoom mechanism 1012 composed of a zoom lens for adjusting a zoom ratio of an optical image and a zoom control circuit. It is also provided with a diaphragm mechanism 1013 for adjusting a light amount entering into image sensor 102, a shutter mechanism 1014 for selectively shut a light, and the like. The focus mechanism 1011, the zoom mechanism 1012, the diaphragm mechanism 1013, and the shutter mechanism 1014 are driven by control signals from the control unit 107.

As described below, the image sensor 102 is provided with a light receiving unit and a compression unit 1021 for performing data compression processing, and the like. The image sensor 102 conducts an image pickup operation, such as an exposure, reading out signals, and resetting signals in line with control signals from the control unit 107. The configuration details and the detailed explanations of the data compression method of the image sensor 102 are provided below.

The image processing unit 103 is provided with a data processing unit 1031 for processing compressed data output from the image sensor 102, and a data holding unit 1032 for temporarily storing compressed data output from image sensor 102. It is also provided with a decompression unit A 1033 that decompress data compressed by the data processing unit 1031, and a decompression unit B 1034 that decompresses compressed data output from the data holding unit 1032, and the like. A detailed description of the data processing by the data processing unit 1031, and a detailed description of the data decompression method by decompression units A and B and the like in unit 103 is provided below.

The video signal processing unit 104 is provided with an AE (Auto Exposure) processing unit (not shown), a white balance adjustment processing unit, a color correction processing unit and the like that operate in line with the control of control unit 107.

The video signal processing unit 104 receives image signals from the image processing unit 103 and conducts further signal processing such as an AE processing, a white balance adjustment processing, and a color correction processing and the like respectively by each of the processing units mentioned above.

The compression/decompression unit 105 follows the control of controlling unit 107 to encode video signals from video signal processing unit 104 into a predetermined still image data format such as the JPEG (Joint Photographic Coding Exports Group) form and the like, and put compressed data of a still image through decompression processing and decoding processing. Also, through an MPGE (Moving Picture Experts Group) method and the like, it can also conduct compression coding/decompression decoding processing of movie images. Compression methods are not limited thereto, and undeveloped images that have not been processed by the compression coding processing may be recorded.

The control unit 107 is provided with an AF calculation unit 112 to calculate a defocus amount that indicates the focus status of image pickup optical system. The defocus amount can be acquired by detecting, for example, the contrast value of images or high frequency components. Based on the defocus amount calculated by the AF calculation unit 112, the control unit 107 calculates the drive amount of the focus lens to reach an in-focus status and sends a control signal corresponding to the drive amount to the focus mechanism 1011.

The focus mechanism 1011 follows the control signal from the control unit 107 to move the focus lens to a designated position. Any other method for detecting a defocus amount can be applicable. For example, the image sensor 102 may include focus detection pixels for obtaining phase difference signals that corresponds to the defocus amount, and the defocus amount may be calculated based on outputs of the focus detection pixels, by using a phase difference method.

The control unit 107 is a micro-controller with a computer function consisting of a CPU (Central Processing unit), ROM (Read Only Memory), RAM (Random Access Memory) and the like. By installing a computer program recorded on the ROM and the like, the control unit 107 controls various units of the imaging apparatus as a whole.

The light emitting unit 108 is a device that emits light to an object when it has been determined that an exposure value is low as a result of the AE processing by video signal processing unit 104, and comprises a flash apparatus using a xenon tube, an LED apparatus, or the like. The operation unit 109, which consists of operation keys such as a shutter release button, a lever, a dial, a touch panel, and the like, outputs operation signals according to a user operation to the control unit 107.

The image display unit 110 consists of display devices such as an LCD (Liquid Crystal Display) and the like, as well as an interface circuit for the display devices. In accordance with image signals provided by the control unit 107, it generates image signals to be displayed on a display device and sends them to the display device for displaying the image.

The image recording unit 111 includes, for example, a removable portable memory, an optical disk, a HDD (Hard Disk Drive), a magnetic tape, and the like. In addition, it receives image file data compressed/decompressed by the compression/decompression unit 105 from control unit 107 to record it, and reads out designated data according to control signals from the control unit 107 and outputs it to control unit 107.

Figure 2A:
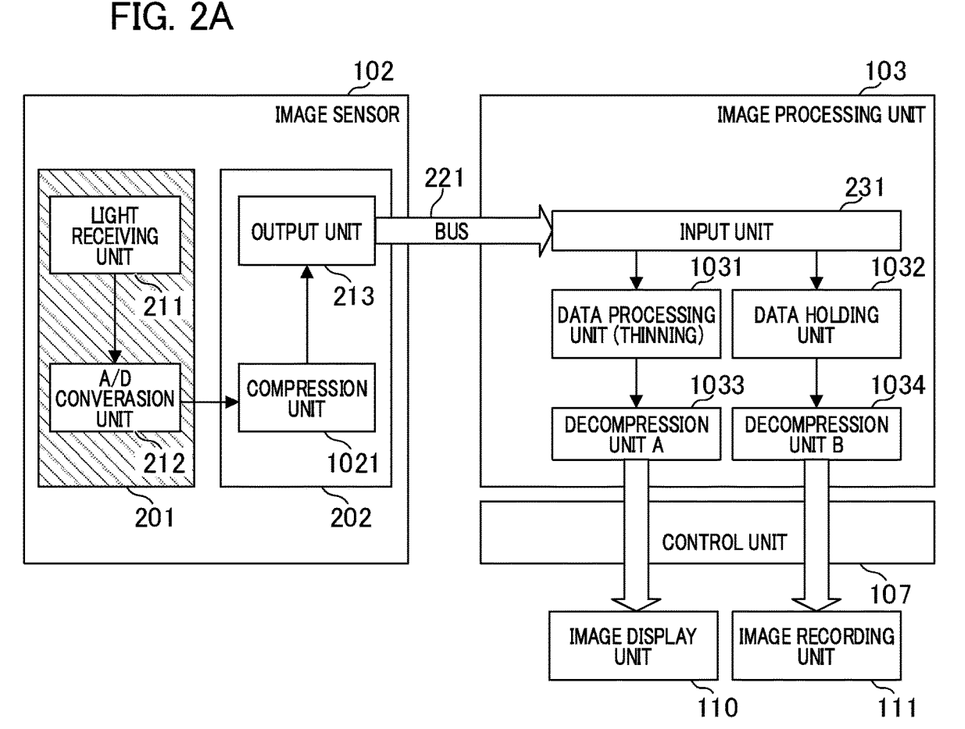
FIG. 2A is a block diagram showing an image sensor and an image processing unit according to a first embodiment.
Figure 2B:
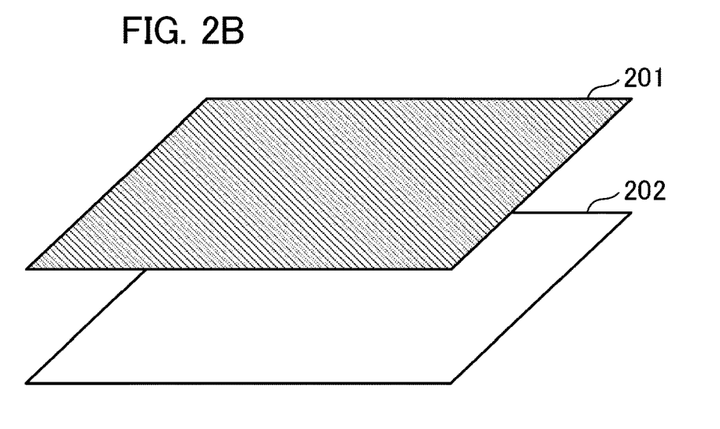
FIG. 2B is a diagram illustrating substrates of the image sensor according to the first embodiment.
Figure 2C:
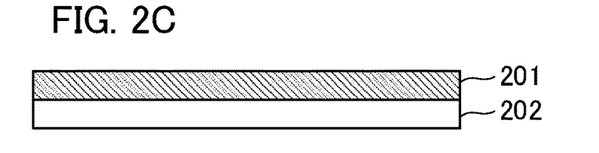
FIG. 2C is a diagram illustrating a multilayer structure of the image sensor according to the first embodiment.

FIG. 2 is a block diagram showing configurations of image sensor 102 and image processing unit 103 according to the first embodiment. The image sensor 102 is configured to pick up an image, obtain the digital data (image data), and compress it before outputting. The image sensor 102 is, for example, a CMOC (Complementary Metal Oxide Semiconductor), a CCD (Charge Coupled Device) and the like.

As shown in the FIG. 2A, the image sensor 102 includes a semiconductor substrate 201, which is represented by a shaded area, and a semiconductor substrate 202, which is represented by a blank area. The semiconductor substrate 201 and the semiconductor substrate 202 are sealed together in an overlapped state (laminated) as shown in FIG. 2B, and integrated as a module.

As shown in a FIG. 2C, semiconductor substrate 201 and semiconductor substrate 202 form a stacked layer (lamination layer). Circuits formed on the semiconductor substrate 201 and those formed on the semiconductor substrate 202 are interconnected by a VIA technology or by installing bridge electrodes.

In this manner, the image sensor 102 is a module chip such that the semiconductor substrate 201 and the semiconductor substrate 202 are integrated to form a multiple layer structure (LSI (large scale integration) chip). Due to the semiconductor substrate 201 and the semiconductor substrate 202 forming a multi-layer structure in this manner within a module, the image sensor 102 can realize the implementation of a larger scale circuit without expanding the size of semiconductor substrate.

Specifically, the image sensor 102 is able to implement a larger scale circuit while preventing cost increase. The form of multiple layers is not limited to a two-layer structure as shown in the FIG. 2, but can include three or more layers. By increasing the number of layers, a large volume memory and the like can be installed in the image sensor 102.

In the semiconductor substrate 201, the light receiving unit 211, and the A/D conversion unit 212 are configured as shown in the FIG. 2A. In the semiconductor substrate 202, the compression unit 1021 and the output unit 213 are configured. Note that the light receiving unit 211 and the A/D conversion unit 212 may be arranged on different semiconductor substrates.

The light receiving unit 211 is configured to receive incident light for photoelectric conversion. In the light receiving unit 211, a plurality of unit pixels each containing a photo electric transducer such as photodiode and the like are disposed two-dimensionally. In each unit, an electric charge, which was generated through photo-conversion of incident light, is accumulated.

The light receiving unit 211 outputs an electric charge accumulated in each unit pixel to the A/D conversion unit 212 as electrical signals (pixel signals). In the present embodiment, the A/D conversion unit 212 is assumed to have a configuration wherein the A/D conversion unit 212 include a lot of A/D conversion elements and each of them is shared by unit pixels that are arranged in a row direction. However, the configuration of A/D conversion elements is not limited to that. For example, each of A/D conversion elements can be shared by unit pixels in predetermined corresponding block or each of A/D conversion elements can be provided for each unit pixel.

Note that the light receiving unit 211 includes a plurality of focus detection pixels for defocus detection by a phase difference method. As focus detection pixels, for example, a pair of photoelectric conversion units may be included in each unit pixel, wherein the pair of photoelectric conversion units respectively photo-convert incident light from different exit pupils. Alternatively, a light blocking layer may be provided at the front surface of each of a plurality of predetermined photoelectric conversion units so that light from corresponding different exit pupil can be photoconverted pixel by pixel.

While multiple focus detection pixels need to be provided in a direction that separates the exit pupil, in the present embodiment, focus detection pixels are arranged in a row direction as the exit pupils are separated in a row direction. By matching the positional relation of the unit of compression and the focus detection pixels, which is disclosed below, signals output from focus detection pixels can be effectively compressed and decompressed. Note that each pixel of the light receiving unit 211 is provided with a micro lens and a color filter having a predetermined spectral transmittance to effectively acquire incident light.

The A/D conversion unit 212 A/D converts each pixel signal provided by the light receiving unit to generate digitalized pixel data. The A/D conversion unit 212 provides the collection of pixel data as image data, which was generated in the above disclosed manner, to the compression unit 1021.

The compression unit 1021 compresses image data provided by A/D conversion unit 212 in a row direction by a unit of a predetermined pixel block to generate compressed data. Thereby, the data volume of the image data is reduced.

As shown in the FIG. 2, compression unit 1021 is implemented on image sensor 102. Specifically, compression unit 1021 is realized by the circuit built in the image sensor 102 or software implemented inside the image sensor 102, or combination thereof. A compression method by the compression unit 1021 is basically arbitrary chosen, a simple method can be applied since it should be implemented on the image sensor 102 (within the module).

While JPEG and MPEG are major examples of image data compression methods, those compression method are complex and involves large scale circuits, so that it tends to increase production costs of image sensor 102. Accordingly, it is generally difficult to implement such an advanced compression method in image sensor 102 as a circuit or software. Even if it is implemented, it often becomes impractical as a delay is caused by a long processing time, and coding processing cannot keep up with the frame rate, and the like. Furthermore, as the compression rate varies, there may be no contribution to the number of pins or bus bandwidth.

As a consequence, for the compression unit 1021 in the present embodiment, image data is compressed by a method that is simpler than JPEG or MPE, takes shorter processing time, and can fit to the semiconductor substrate 201 in the image sensor 102. Hereafter, such compression is also called "simple compression". That is, the compression unit 1021 applies the "simple compression" to the image data (RAW data) provided by the A/D conversion unit 212 to generate compressed data.

The A/D conversion unit 212 provides the pixel data (image data) of each unit pixel to the compression unit 1021 row by row. If multiple rows of image data need to be held/buffered during compression, there is a risk that the processing time may increase in proportion thereto. Also, there is a risk that the size of the buffer circuit may get larger and the space for other circuits may be reduced.

Accordingly, in the present embodiment, the simple compression method is adopted so that the image data provided by the A/D conversion unit 212 is successively compressed in the unit of pixel block without holding/buffering data.

The unit of pixel block to be compressed does not have to be a unit of one row. For example, if multiple rows can be read out together from the A/D conversion unit 212, the unit may be a two-dimensional unit including multiple rows as a pixel block, corresponding to the multiple rows read out together.

For example, as the simple compression, DPCM (Difference Pulse Code Modulation) may be adopted. Details are explained below.

The compression unit 1021 provides compressed data compressed through the simple compression to output unit 213.

The output unit 213 is made of, for example, I/O cells or I/O pins and the like, and outputs the compressed data provided by compression unit 1021 to the outside of the image sensor 102. The compressed data output from the output unit 213 is supplied to the input unit 231 of the image processing unit 103 via a bus 221. The bus 221 consists of high-speed differential pairs conforming to the standards such as LVDS and SLVS.

The image processing unit 103 is for processing image data obtained from the image sensor 102. As shown in FIG. 2A, the image processing unit 103 is provided with an input unit 231, the data processing unit 1031, the data holding unit 1032, the decompression unit A 1033, and the decompression unit B 1034 and the like.

The input unit 231 receives compressed data transmitted from the output unit 213 in the image sensor 102 via the bus 221. The input unit 231 supplies the compressed data to the data processing unit 1031 and the data holding unit 1032.

Subsequently, the data the processing unit 1031 provides the compressed data that has been provided by the input unit 231 to the decompression unit A 1033. At this timing, the data processing unit 1031 selects compressed data row by row so that only the predetermined rows are supplied to the decompression unit A 1033.

In other words, it successively thins out the compressed date row by row. Whether to provide compressed data to the decompression unit A 1033 may be decided based on flag data attached to the compressed data itself or a counter (not shown) and the like provided with the image processing unit 103. Whether to provide compressed data to the decompression unit A 1033 may be determined not in a unit of row but in a unit of compression block used in the compression unit 1021.

The decompression unit A 1033 decompresses the compressed data provided by the data processing unit 1031 in row units by a method reversely corresponding to the compression method of the compression unit 1021 to reproduce image data. A flow of image data from the compression unit 1021 to the decompression unit A 1033 will be described in detail below.

The data holding unit 1032 provides compressed data that has been provided by input unit 231 to the decompression unit 1034.

The data holding unit 1032 temporarily holds the compressed data provided by input unit 231 and sends the compressed data to the decompression unit B while arbitrarily changing the speed and timing of data output. The data holding unit 1032 includes RAM and the like. This enables a certain amount of compressed data, which is output at a high speed from the image sensor 102, to be held at the data holding unit 1032.

Therefore, the data output speed from the data holding unit 1032 to the decompression unit B 1034 can be decreased so that the data can be properly processed by the image processing unit 103 within its data processing capability.

Figure 3:
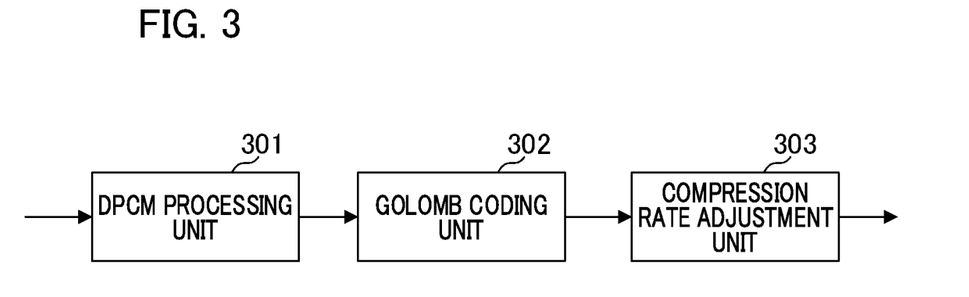
FIG. 3 is a block diagram showing a configuration of a compressing unit according to the first embodiment.

FIG. 3 is a block diagram that shows a configuration of the compression unit 1021 in FIG. 2. In FIG. 3, the compression unit 1021 has a DPCM processing unit 301, a Golomb coding unit 302, and a compression rate adjustment unit 303.

The DPCM processing unit 301 calculates the difference value between adjacent pixels of serial pixel data (one dimensionally aligned pixel data) of image data provided by the A/D conversion unit 212 in a unit of a row. When the serial pixel data read out from the data image sensor 102 and A/D converted includes color data corresponding to different color filters pixel by pixel, the difference value should be calculated between the pixel data corresponding to the same color filter.

The DPCM processing unit 301 provides calculated difference values to the Golomb coding unit 302.

The Golomb coding unit 302 converts the difference values provided by the DPCM processing unit 301 into Golomb codes. The data converted into Golomb code by the Golomb coding unit 302 is provided to the compression rate adjustment unit 303.

The compression rate adjustment unit 303 adjusts a compression rate of compressed data provided by the Golomb coding unit 302 and converts it to a predetermined compression rate. Thereby, the compressed data having the predetermined compression rate can be obtained from the image data captured by the light receiving unit 211.

While the compression rate may be variable, the maximum transmittable bandwidth of the bus 221 is limited by hardware factors, so that the compression rate should be fixed. The compression rate adjustment unit 303 outputs the compressed data whose compression rate has been fixed or substantially fixed to the output unit 213.

With such a configuration, the compression unit 1021 can easily but irreversibly compress image data (RAW data). A reversible compression method such as JPEG and the like is not applied, but data is irreversibly compressed within an image sensor in the present embodiment, and both the circuit scale and the processing load can be saved.

In general, however, when the image data has been irreversibly compressed, an image cannot be displayed unless the image data is decompressed after being stored frame by frame. However, in the present embodiment, by compressing and decompressing an image row by row, the image in row unit can be successively displayed in a real time manner. It also makes possible to successively carry out an AF calculation in parallel and in a real time manner.

Here, the real time image display row by row and real time AF calculation in parallel do not mean decompressing data or displaying image or conducting the AF calculation after one frame data is obtained, but display image or conducting AF calculation before one frame data is obtained.

Also, in the present embodiment, the compression rate adjustment unit 303 optimizes the bandwidth of data so that it is narrower than the maximum transmittable bandwidth of the bus 221.

While the Golomb coding is used as an example in this embodiment, it is not the only option, and Huffman coding and Rice coding may be also applied as the simple compression. The Golomb coding, however, is the most applicable data compression method within an image sensor as it takes the least load.

Figure 4:
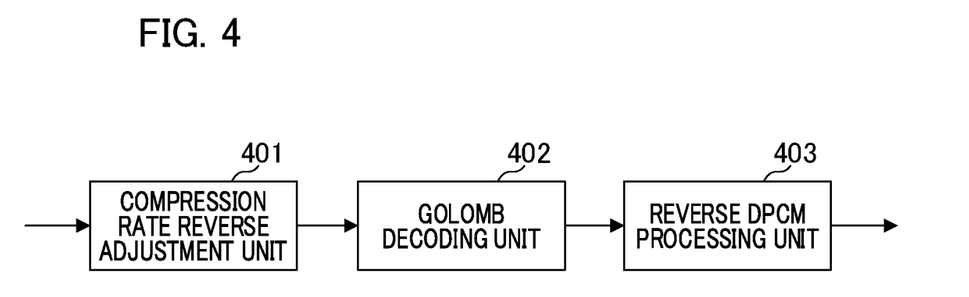
FIG. 4 is a block diagram showing a configuration of a decompression unit according to the first embodiment.

FIG. 4 is a block diagram showing configurations of the decompression unit A 1033 and the decompression unit B 1034. In the example presented in the FIG. 4, the decompression unit A 1033 and the decompression unit B 1034 decompress the compressed data in a way that corresponds to the compression unit 1021. As shown in the FIG. 4, in this case, the decompression unit A 1033 and the decompression unit B 1034 are provided with a compression rate reverse adjustment unit 401, a Golomb decoding unit 402, and a reverse DPCM processing unit 403.

The compression rate reverse adjustment unit 401 executes reverse processing of the processing of the compression rate adjustment unit 303 on the compressed data provided by input unit 231 to decode a Golomb code generated by the Golomb coding unit 302. The compression rate reverse adjustment unit 401 provides the Golomb code to the Golomb decoding unit 402.

The Golomb decoding unit 402 decodes the Golomb code provided by the compression rate reverse adjustment unit 401 by a method that is reverse to the coding method of the Golomb coding unit 302 to reproduce the difference values produced by DPCM processing unit 301. The Golomb decoding unit 402 provides the reproduced difference values to the reverse DPCM processing unit 403.

The reverse DPCM processing unit 403 conducts reverse DPCM processing (reverse processing to DPCM performed by DPCM processing unit 301) on the difference values provided by the Golomb decoding 402 to reproduce pixel data. The reverse DPCM processing unit 403 outputs a collection of reproduced pixel data to the outside of the decompression unit A 1033 and the decompression unit B1034 as image data. Specifically, data from the decompression unit A 1033 is output to the control unit 107 and then is provided to the image display unit 110, and the output from the decompression unit B 1034 is provided to image recording unit 111 via the control unit 107.

With the above disclosed configuration, the decompression unit A 1033 and the decompression unit B 1034 can correctly reproduce the compressed data generated by the compression unit 1021. This means that the decompression unit A 1033 and the decompression unit B 1034 can realize the decompression of image data.

Next, the image data processing by the compression unit 1021, the data processing unit 1031, and the decompression unit A 1033 in the present embodiment will be explained referring to FIG. 5.

Figure 5A:
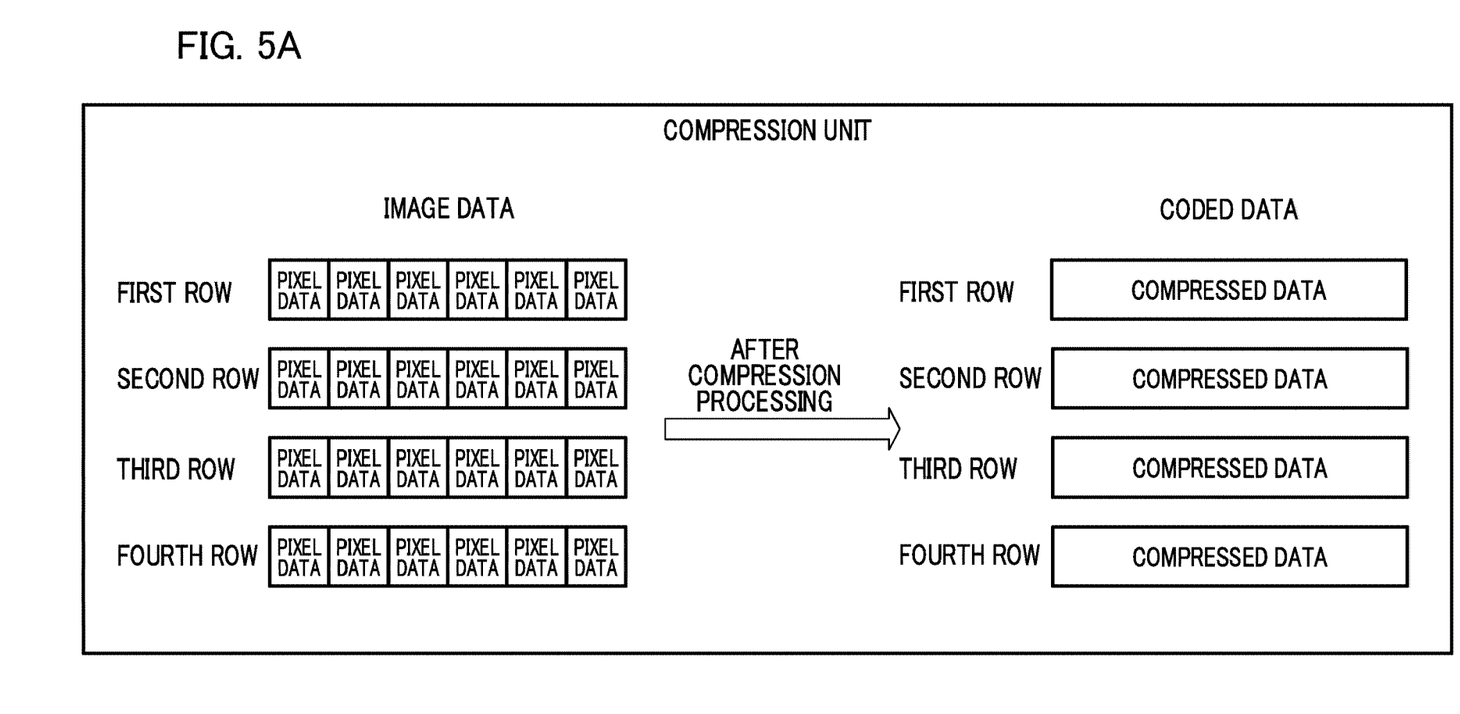
FIG. 5A is a diagram illustrating an operation of the compression unit according to the first embodiment.

FIG. 5A schematically shows the data processing by the compression unit 1021. FIG. 5B schematically shows data processing in the data processing unit 1031, and FIG. 5C schematically shows data processing in the decompression unit A 1033.

While FIG. 5A simply shows image data of 24 pixels consisting of 6 pixels in each horizontal row and 4 rows arranged vertically, the light receiving unit 211 contains far more pixels both horizontally and vertically.

FIG. 5A shows that image data consisting of 6 columns/4 rows, which was converted into digital data in the A/D conversion unit 212, is input row by row with respect to a predetermined pixel blocks.

In the present embodiment, a unit of data block consisting of 6 pixels in a row is compressed at a time. The image data input into the compression unit 1021 is compressed unit by unit with the compression method shown in the FIG. 3 to be converted into compressed data. While the data is compressed by a unit of data block consisting of 6 pixels in a row, in the present embodiment, the unit of data block is not limited to 6 pixels in a row. Note that data compressed row by row in the compression unit 1021 is input into the data processing unit 1031 via output unit 213 and input unit 231.

Figure 5B:
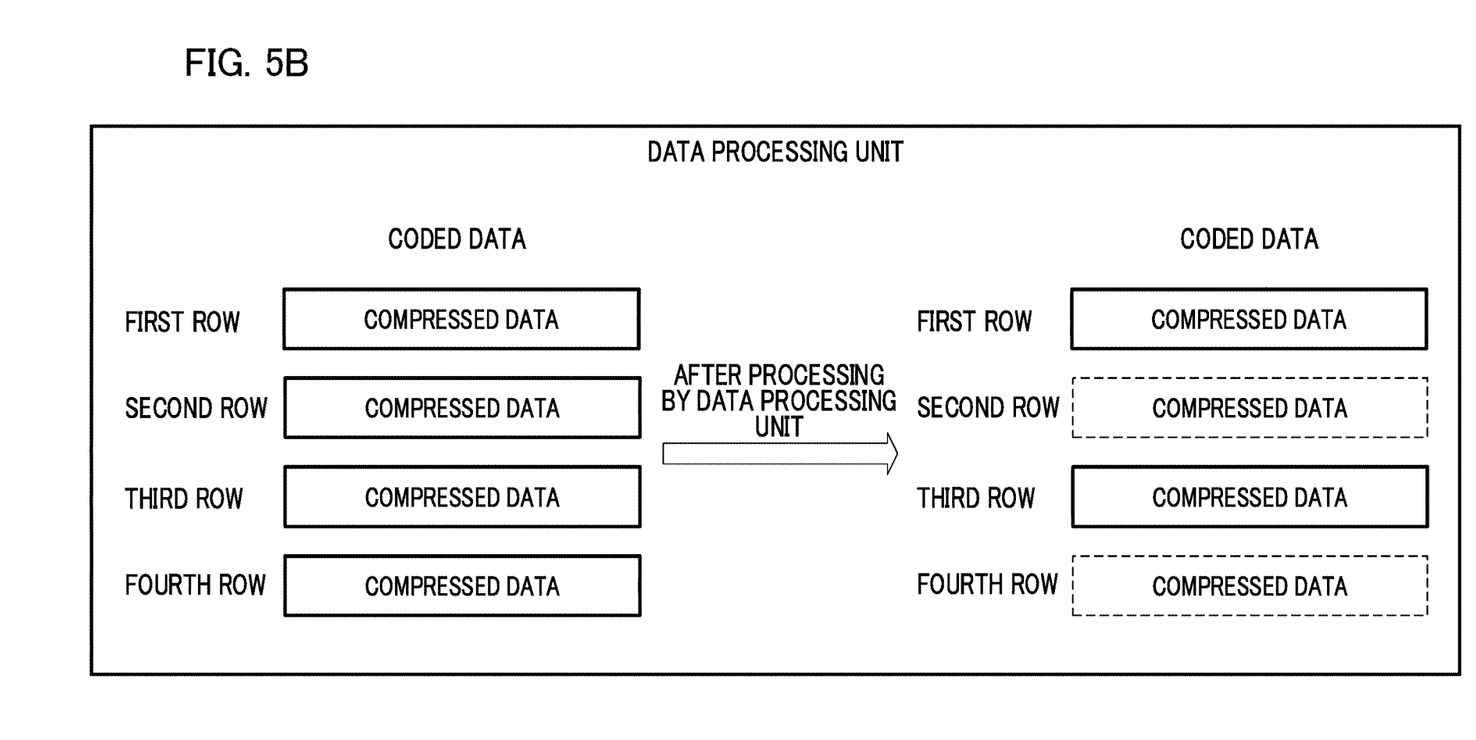
FIG. 5B is a diagram illustrating an operation of the data processing unit according to the first embodiment.

In FIG. 5B, 2nd and 4th rows of data out of compressed data of 4 rows in FIG. 5A are thinned sequentially in the processing unit 1031 so that data volume is reduced to half.

The compressed data after the above thinning by a data processing unit is input into the decompression unit A 1033.

Figure 5C:
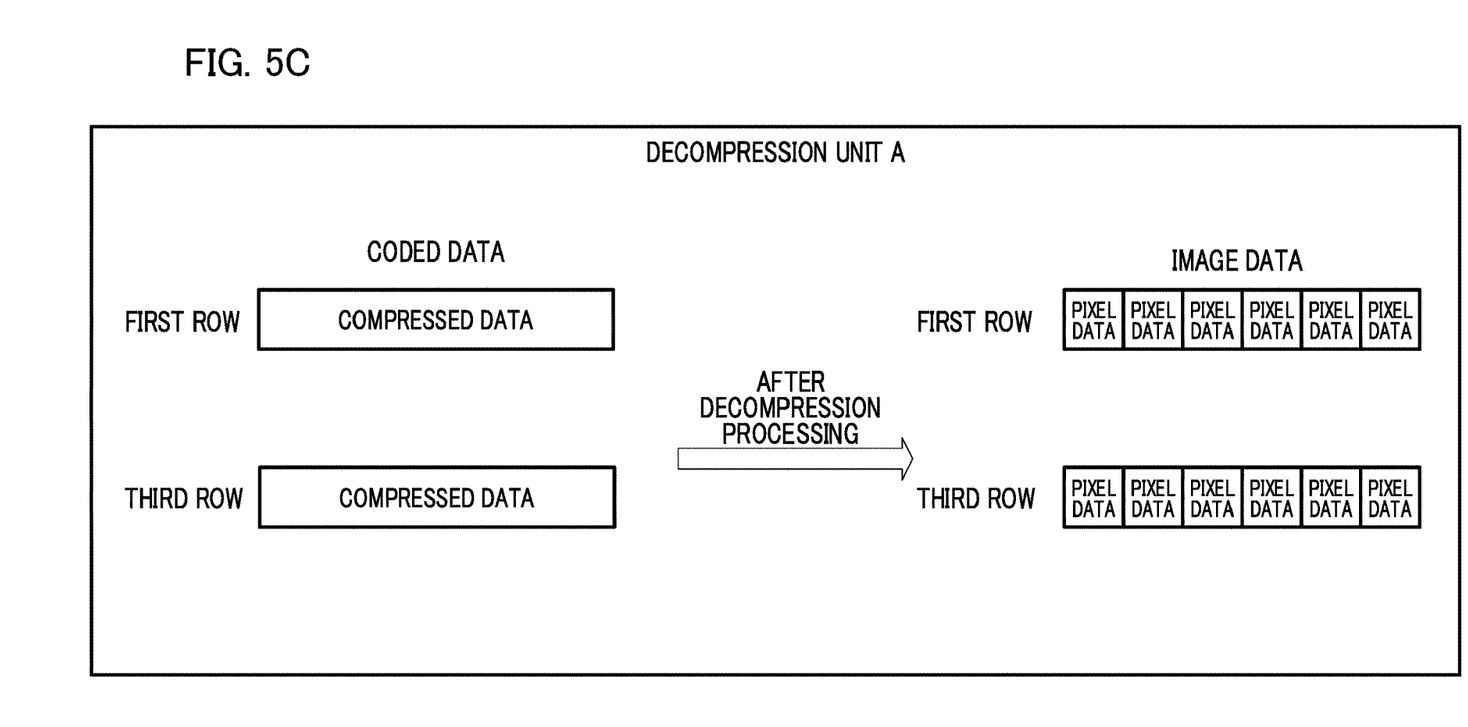
FIG. 5C is a diagram illustrating an operation of the decompression unit according to the first embodiment.

As shown in the FIG. 5C, the compressed data that only includes 1st and 3rd rows is sequentially decompressed row by row through the decompression method as explained in the FIG. 4 in the decompression units A 1033. Then, via the control unit 107, image data is output to the image display unit 110 to be successively displayed row by row on a real time basis. Note that being able to display images on a real time basis while decompressing data is one of major features of the present embodiment. For further data reduction, such as thinning or adding processing may be done after the decompression. Especially in this embodiment, as the number of columns of the image data is larger than that of the rows after decompression processing, the load and time can be reduced by having them undergo thinning and adding processing.

Figure 6:
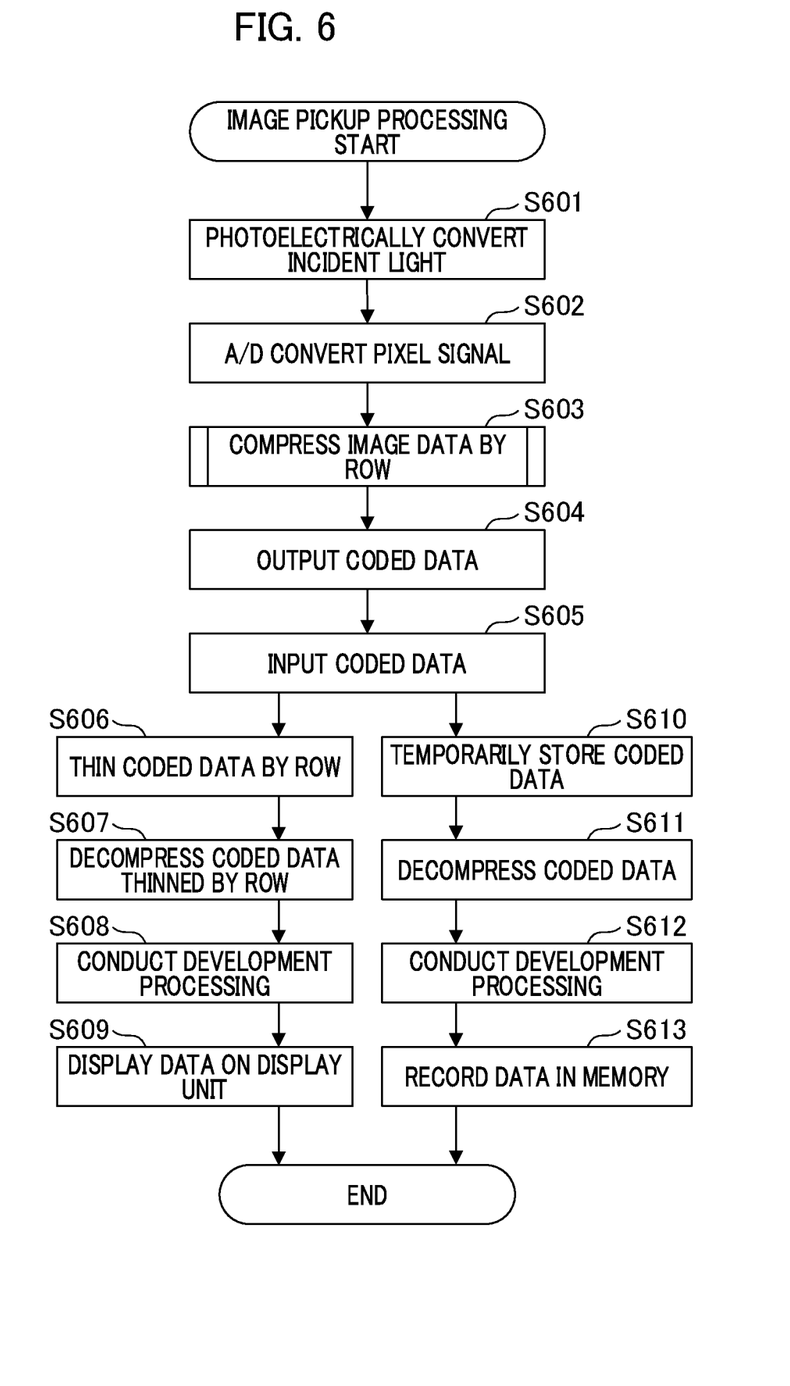
FIG. 6 is a flow chart showing a flow of the imaging processing according to the first embodiment.

Below, the flow of image pickup processing by image sensor 102 is explained referring to FIG. 2A together with the flowchart in FIG. 6.

This image pickup processing is conducted when image sensor 102 picks up the image of an object and obtains the image data of that object.

Once image pickup processing has commenced, the light receiving unit 211 photoelectrically converts incident light in each unit pixel of an effective pixel area in step S601.

In step S602, the A/D conversion unit 212 A/D converts a pixel signal (analogue data) for each unit pixel that was obtained through the processing of step S601 so that digital image data is obtained.

In step S 603, the compression unit 1021 generates compressed data row by row by compressing image data, which is a collection of pixel data of digital data, obtained through step S602.

In step 604, the output unit 213 outputs the compressed data obtained through step S603 to the outside of image sensor 102 (via the bus 221) row by row In step S605, in the input unit 231, the compressed data, which was output through step S604, is input into the image processing unit 103 and then output to the data processing unit 1031 and to the data holding unit 1032.

In step S606, when the compressed data is input into the data processing unit 1031 row by row, a part of the compressed data is thinned and data thinning processing are successively conducted.

In step S607, by decompressing the compressed data row by row in the decompression unit A 1033, the compressed data is decompressed to reproduce the image data.

In step S608, row image data decompressed in step S607 undergoes signal processing (development processing), including white balance adjustment and color correction adjustment and the like, by video signal processing unit 104. In due course, in step S609, successive real time display is conducted via the control unit 107 with the image display unit 110.

In step S610, the compressed data, which was output row by row from the input unit 230 in step 605, is temporarily held by the data holding unit 1032. In data transfer after data holding unit 1032, the data bus bandwidth can be reduced by lowering the speed of data output from the data holding unit 1032 below that of data input. For example, when data input speed is 120 frames per second and the output speed is set to 30 frame per second, the data bus bandwidth can be reduced to ¼.

In step S611, through decompression of the compressed data by the decompression unit B 1034, the compressed data is decompressed to reproduce the image data.

In step S612, the image data decompressed in step S611 undergoes signal processing (development processing) such as white balance adjustment processing and color correction processing and the like, by the video signal processing unit 104. After such processing, in step S613, the data is recorded by a recording device such as an SD card of the image recording unit 111 via control unit 107. Before recording, data may be compressed to JPEG and the like.

As disclosed above, because image data is read in the form of compressed data from an image sensor, both data load and data transfer volume between processing circuits can be reduced. As a consequence, data transfer can be done with a narrow data bus bandwidth, and image processing circuits can be downsized. In the present embodiment, as simple lossy compression (irreversible compression) is performed within the image sensor, the circuit for the image sensor can be downsized, and processing load can be reduced.

When such lossy compression is conducted, an image cannot be displayed unless it is decompressed after being buffered and aligned by frame. However, in the present embodiment, the image can be displayed on a real time basis by being compressed, decompressed, and displayed. Here, in the present embodiment, although the data processing unit 1031 was installed inside the image processing unit 103, it may be installed in another processing IC circuit arranged between the imaging sensor 102 and the image processing unit 103. Or, it can be provided within the image sensor 102.

Note that in the present embodiment, in the step S605, while the compressed data is output to the data processing unit 1031 and the data holding unit 1032 after it is input into the image processing unit 103, the configuration is not limited thereby. For example, by once holding the entire compressed data in the data holding unit 1032 and then reading only the necessary rows thereof, thinning of the compressed data by the data processing unit 1031 may be realized. Also, data may be output from the decompression unit A 1033 and the decompression unit B 1034 to an external apparatus outside of the imaging apparatus. Examples of external apparatuses include mobile devices such as mobile phones and the like, or a PC and server. Also, data may be output to multiple apparatuses such as cloud servers and the like.

Second Embodiment

In the first embodiment, the data processing unit 1031 in the image processing unit reduced data volume by thinning the number of rows in the image data and the data holding unit 1032 reduced data volume per predetermined time by delaying the time to output data from the data holding unit 1032 to the decompression unit B 1034. However, as the number of picture frames held by the data holding unit 1032 is limited, it becomes difficult to use the data holding unit 1032 to reduce data volume in movie shooting mode, which requires recording of a lot of picture frames.

Figure 7:
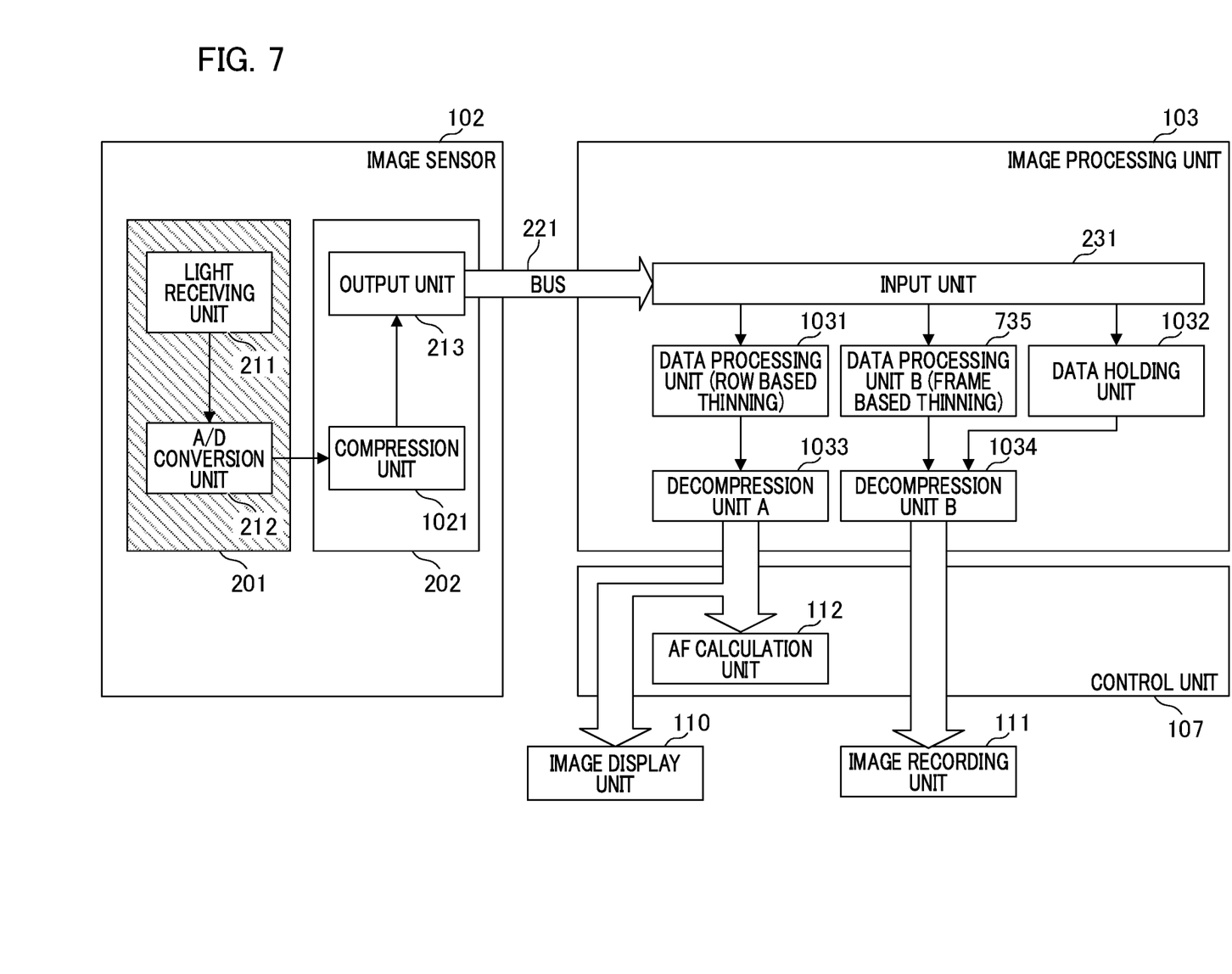
FIG. 7 is an image sensor and an image processing unit according to a second embodiment.

In the second embodiment, an example in which both focus control and movie recording can be conducted in parallel in movie shooting mode is explained referring to a block diagram in FIG. 7. Specifically, in an image processing unit 103, the data that has been thinned row by row by the data processing unit 1031 is used in the calculation of the defocus amount by the AF calculation unit 112 in the control unit 107, so that focus control is carried out in parallel. In addition, data that underwent a thinning process row by row is also supplied to the image display unit 110 via the control unit 107, and the image is displayed row by row on a real time basis.

Also, by adding a data processing unit 735 to the image processing unit 103, image data input into the data processing unit 735 is deleted frame by frame in order to carry out focus control and display images on a real time basis. Thereby, movie image recording can also be realized via the control unit 107 without expanding the data bus bandwidth.

The basic configuration and operation of the image sensor and the imaging apparatus in the second embodiment is explained based on FIG. 7 together with FIGS. 1 to 6 of the first embodiment.

FIG. 7 is a block diagram showing configurations of the image sensor and the image processing unit according to the second embodiment.

As the configuration of image sensor is the same as that in FIG. 2, the explanation thereof is omitted here.

As the configuration of image processing unit is the same as that of the input unit 231, the data processing unit 1031, the data holding unit 1032, the decompression unit A 1033, and the decompression unit B 1034 in FIG. 2, the explanation thereof is omitted here.

In FIG. 7 in the present embodiment, an image processing unit 103 is provided not only with the data processing unit 1031 and the data holding unit 1032, but also the data processing unit B 735.

The data processing unit B 735 carries out thinning processing frame by frame on the compressed data output from the input unit 231, and outputs the thinned data to the decompression unit B 1034. Thereby, data can be transferred without being temporarily retained and with a narrow data bus bandwidth.

In the present embodiment, the data decompressed by the decompression unit A 1033 is sent to the AF calculation unit 112 in control unit 107 to be used for calculating a defocus amount, which corresponds to a focus status of the image pickup optical system on a real time basis. Also, the data is sent to the image display unit 110 to be used in real time image display.

In contrast, the data decompressed by the decompression unit B 1034 is recorded in the recording unit 111 as video data via control unit 107.

In still image shooting mode, data processing unit B 735 is not used, but an image, which was once held in the data holding unit 1032, is recorded in the image recording unit 111 as a still image via control unit 107 after being decompressed by the decompression unit B 1034. As necessary, the image can be compressed in the form of JPEG and the like, before being recorded.

Figure 8:
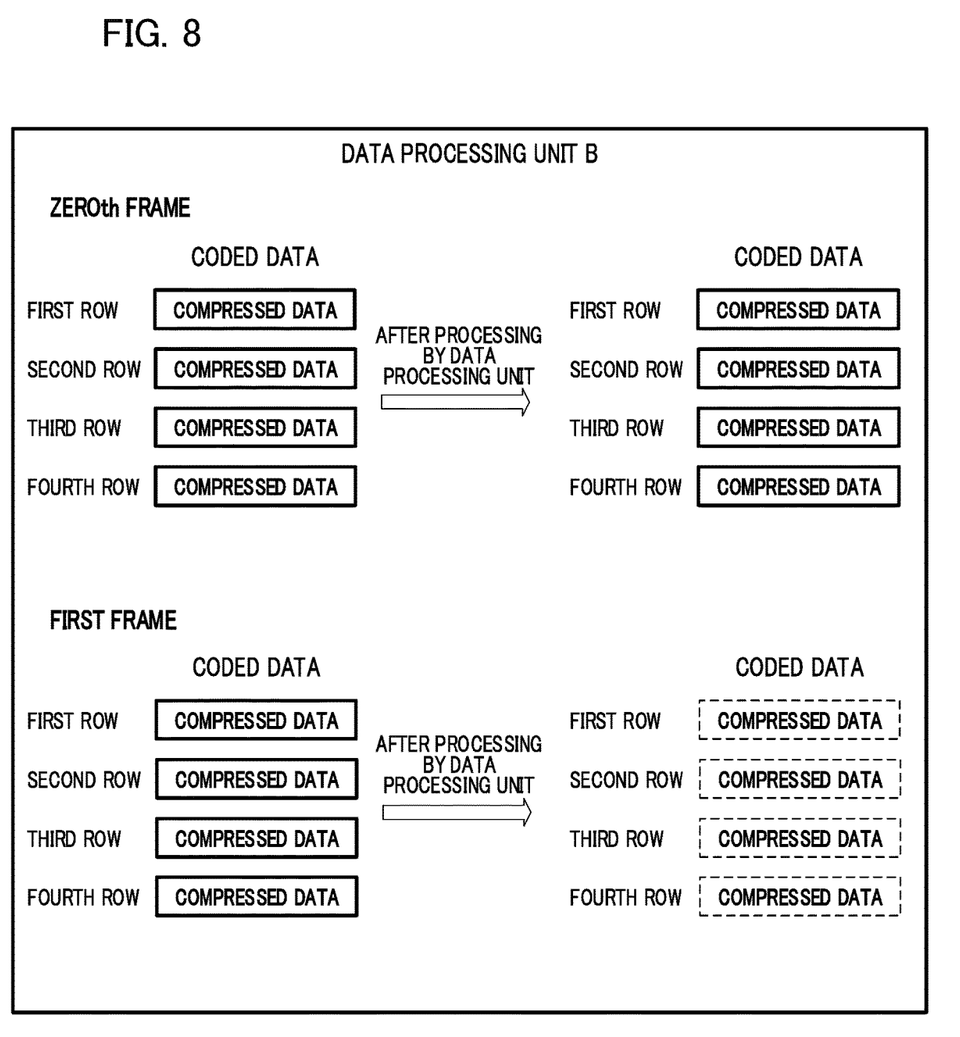
FIG. 8 is a diagram illustrating an operation of the data processing unit according to the second embodiment.

FIG. 8 will be used for explaining the processing of compressed data by the data processing unit 735.

FIG. 8 schematically shows the data processing of compressed data by the data processing unit 735. As with FIG. 5, the explanation is made with compressed data of 4 rows in FIG. 8.

When compressed data is input from the input unit 231 into the data processing unit 735 in FIG. 8, in the zeroth frame (even number frames), compressed data is output to the decompression unit B 1034 as-is. Then the compressed data of the first frame (odd number frames) is input from the input unit 231 to the data processing unit 735, all of four rows of data are deleted by the data processing unit 735. This means that no data is output for the first frame (odd number frames).

Figure 9:
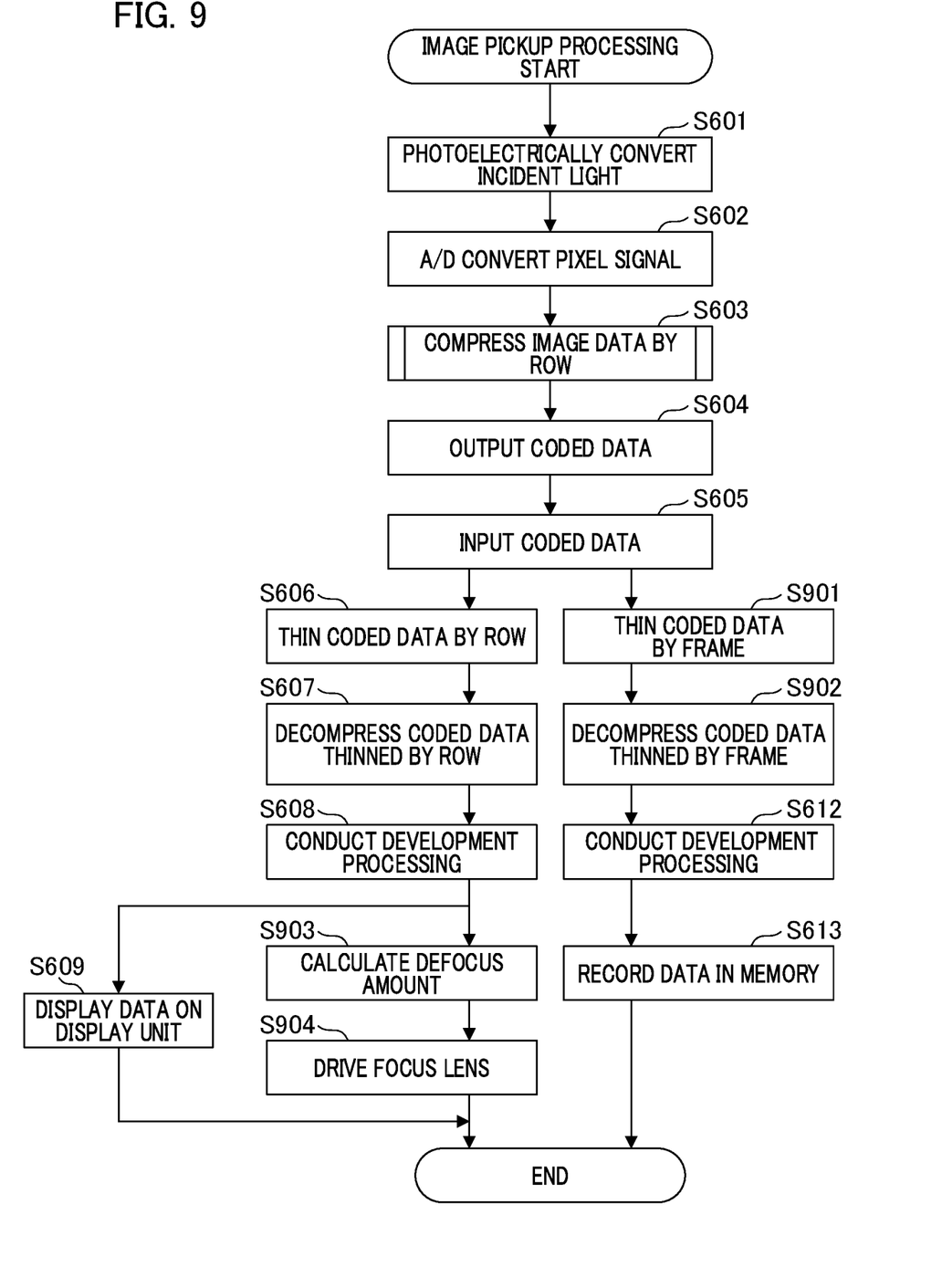
FIG. 9 is a flowchart showing a flow of a photographing process according to the second embodiment.

Next, image shooting processing in the second embodiment is explained with a flow chart in FIG. 9.

FIG. 9 is a flow chart in movie shooting mode. As the processing in steps S601-609 and steps S612-613 is the same as that explained in FIG. 6, the explanation thereof is omitted. However, because this is movie shooting mode, and the cycle of the shooting operation of the image sensor is, for example, 1/60 sec.

In step 605, in the input unit 231, compressed data output by the processing of step S604 is output to the data processing unit 1031 and the data processing unit 735.

In step 901, when the compressed data is input into the data processing unit 735, the compressed data is output to the decompression unit B 1034 when the frame is an even number frame and the compressed data is not output to the decompression unit B 1034 when the frame is an odd number frame.

In step S902, the compressed data output from the processing unit 735 is decompressed by the decompression unit B 1034 and reproduce the image data.

In step S612, image data decompressed in step S902 undergoes signal processing (development processing) such as white balance adjustment, color correction and the like, by signal processing unit 104. Subsequently, the image data is recorded on a recording medium such as the SD card and the like in image recording unit 111 as a movie image via control unit 107 in step S613. Before the recording, the image data may be compressed in the form of MPEG and the like.

Data, which went through development processing by the video signal processing unit 104 in step S 608, is input into the control unit 107 in step S 903. A defocus amount (for example, the contrast value, value or the difference of high frequency component and the like), which indicates the focus status of the image pickup optical system in AF calculation unit 112 in control unit 107, is calculated row by row on a real time basis. In parallel, the data, which has undergone the development processing by the video signal processing unit 104 in step S608, is provided to the image display unit 110 via control unit 107 row by row and displayed as a real time image.

In step S 904, based on the defocus amount calculated in step S 903, a control signal is sent from the control unit 107 to the focus mechanism 1011 to drive the focus lens.

By thinning the compressed data frame by frame, which have been compressed to lossy compressed (irreversibly compressed) data, data transfer volume can be reduced even during shooting movie images. Consequently, data can be transferred with a narrow data bus bandwidth, and the circuit size in the image processing circuit can be downsized. Furthermore, the image display, the AF calculation and like can be realized on a real time basis.

In the embodiments, the meaning of what is explained as being successive or sequential is, for example, displaying an image of a row or calculating the defocus amount of the row each time when the row signal is provided. When something is explained to be row by row, naturally it may be by units of one row or multiple rows.

The present invention can be realized in processes in which a program that executes one or more functions of the above embodiment is supplied to a system or a device through a network or a storage medium, and one or more processors in a computer of the system or the device read and execute the program. In addition, the present invention can be realized by a circuit (for example, an ASIC) that implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-155765 filed on Aug. 22, 2018, which is hereby incorporated by reference herein in its entirety.

What is claimed is:

1. An imaging apparatus comprising:
   (a) an image sensor having units of semiconductor substrates which are integrated as a module including:
      a plurality of light receiving units disposed in rows and columns;
      an A/D converter that converts image signals output from the plurality of light receiving units to image data;
      a compressor that compresses the image data in a row direction by a unit of a predetermined pixel block consisting of a predetermined number of light receiving pixels; and
      an output unit that outputs compressed image data from the image sensor; and
   (b) a processor including:
      an input unit that input the compressed image data output from the image sensor;
      a first data processor in which a frame of the compressed image data undergoes thinning processing by the unit of the predetermined pixel block;
      a first data decompressor that decompresses outputs of the first data processor; and
      a first image processor that carries out a predetermined processing for displaying images on outputs of the first data decompressor.

2. The imaging apparatus according to claim 1, wherein the first image processor includes a first developing unit.

3. The imaging apparatus according to claim 1, further comprising;
   a second data processing unit that carries out thinning processing frame by frame on outputs of the compression unit of the image senor.

4. The imaging apparatus according to claim 3, further comprising; a second data decompressing unit for decompressing data output from the second data processing unit.

5. The imaging apparatus according to claim 4, further comprising a second developing unit for carrying out developing process on outputs from the second data decompressing unit.

6. The imaging apparatus according to claim 5 further comprising a recording unit for recording outputs of the second developing unit as a movie image.

7. The imaging apparatus according to claim 1, further comprising a display unit for displaying data supplied row by row from the first developing unit in real time.

8. The imaging apparatus according to claim 1, further comprising a defocus amount calculation unit for calculating a defocus amount in real time using outputs of the first developing unit.

9. The imaging apparatus according to claim 1, further comprising a data storage unit for temporarily storing the compressed image data output from the image sensor.

10. The imaging apparatus according to claim 1, wherein the compressor irreversibly compresses an output from the A/D converter by the unit of the predetermine pixel block arranged in a row direction.

11. The imaging apparatus according to claim 1, wherein the compressor includes a DPCM processor that carries out DPCM processing on outputs from the A/D converter.

12. The imaging apparatus according to claim 11, wherein the compressor includes a coding unit for coding outputs of the DPCM processor.

13. The imaging apparatus according to claim 12, wherein the compressor includes a compression ratio adjusting unit for adjusting a compression ratio of data output from the coding unit.

14. The imaging apparatus according to claim 13, wherein the compression ratio adjusting unit adjusts the compression ratio so that the compression ratio becomes within a predetermined range.

15. The imaging apparatus according to claim 12, wherein the coding unit includes a Golomb coding unit.

16. The imaging apparatus according to claim 1, wherein the image sensor includes a plurality of substrates that forms a multilayered structure, wherein the light receiving unit and the compressor are respectively arranged in different substrates.

* * * * *